United States Patent [19]

Chen

[11] Patent Number: 5,498,895
[45] Date of Patent: Mar. 12, 1996

[54] PROCESS ESD PROTECTION DEVICES FOR USE WITH ANTIFUSES

[75] Inventor: Wenn-Jei Chen, Sunnyvale, Calif.

[73] Assignee: Actel Corporation, Sunnyvale, Calif.

[21] Appl. No.: 290,029

[22] Filed: Aug. 12, 1994

Related U.S. Application Data

[63] Continuation-in-part of Ser. No. 277,673, Jul. 19, 1994, which is a continuation of Ser. No. 87,942, Jul. 7, 1993, Pat. No. 5,369,054.

[51] Int. Cl.$^6$ .............................. H01L 27/01; H01L 29/00
[52] U.S. Cl. .............................. 257/355; 257/50; 257/530
[58] Field of Search ........................... 257/530, 50, 355

[56] References Cited

U.S. PATENT DOCUMENTS

| | | |
|---|---|---|
| 4,821,096 | 4/1989 | Maloney . |
| 4,829,350 | 5/1989 | Miller . |
| 4,862,243 | 8/1989 | Welch et al. . |
| 4,941,028 | 7/1990 | Chen et al. . |
| 4,997,790 | 3/1991 | Woo et al. . |
| 5,070,384 | 12/1991 | McCollum et al. . |
| 5,111,262 | 5/1992 | Chen et al. . |
| 5,166,556 | 11/1992 | Hsu et al. . |
| 5,171,715 | 12/1992 | Husher et al. . |
| 5,233,217 | 8/1993 | Dixit et al. . |
| 5,290,734 | 5/1994 | Boardman et al. . |
| 5,341,267 | 8/1994 | Whitten et al. ............................ 361/56 |
| 5,350,710 | 9/1994 | Hong et al. ............................ 437/170 |

FOREIGN PATENT DOCUMENTS

| | | |
|---|---|---|
| 041690 | 3/1991 | European Pat. Off. . |

OTHER PUBLICATIONS

K. E. Gorden et al. "Conducting Filament of the Programmed Metal Electrode Amorphous Silicon Antifuse", IEDM 93 (Dec. 1993) pp. 27–30.

Primary Examiner—J. Carroll
Attorney, Agent, or Firm—D'Alessandro & Ritchie

[57] ABSTRACT

A process electrostatic discharge ("ESD") protection device is incorporated on a chip with the antifuses that it is designed to protect and is formed as close in time as possible to the deposition of the antifuse material layer (the layer being protected) so that ESD protection is available at all practical stages of processing. According to a first aspect of the invention, an ESD protection device is formed by exposing edges of an antifuse bottom electrode during the antifuse cell open mask/etch step, It is biased on during processing. A sharp corner of the electrode and a deep aspect ratio provide degrade antifuse performance for the protection cell (resulting in reduced breakdown voltage and increased leakage current) and, as designed, the protection cell will rupture before other cells because it has a lower breakdown voltage. Once the protection cell ruptures, it will continue to conduct and protect other antifuses from ESD damage. When processing is complete, the protection cell is biased off and has no effect on the remaining antifuses. According to a second aspect of the present invention, a deep valley topography is created under a bottom electrode of the protection cell. Because the cell is deeper than the other antifuse cells while retaining the same cell opening size, the step coverage within the protection cell will be reduced and the protection cell will have a lower breakdown voltage than the regular antifuse cells formed with it. In all other respects, it operates as set forth regarding the first aspect of the invention.

6 Claims, 2 Drawing Sheets

PROCESS ESD PROTECTION DEVICES FOR USE WITH ANTIFUSES

CROSS-REFERENCE TO RELATED APPLICATION

This application is a continuation-in-part of U.S. patent application Ser. No. 08/277,673 filed Jul. 19, 1994 in the names of inventors Yeouchung Yen, Wenn-Jei Chen, Steve S. Chiang and Abdul R. Forouhi and entitled "Circuits for ESD Protection of Metal-to-Metal Antifuses During Processing" and assigned to Actel Corporation which is a continuation of U.S. patent application Ser. No. 08/087,942 filed Jul. 7, 1993 in the name of inventors Yeouchung Yen, Wenn-Jei Chen, Steve S. Chiang and Abdul R. Forouhi and entitled "Circuits for ESD Protection of Metal-to-Metal Antifuses During Processing", now U.S. Pat. No. 5,369,054.

BACKGROUND OF THE INVENTION

1. Field of the Invention

The present invention is directed to a process ESD protection device for use during processing with structures containing antifuses. According to this invention, an ESD protection device is formed as close in time as possible to the formation of the antifuse material layer so that the antifuse devices can be protected from ESD occurring during processing.

2. The Prior Art

Metal-to-metal, metal-to-poly (polysilicon), and poly-to-poly antifuses have become increasingly important in one-time user programmable memory and logic devices. However, making metal-to-metal antifuses in high volume production has not been achieved due to various manufacturability concerns. During the fabrication process used for manufacturing antifuse elements, the wafer is exposed to environments which are potentially harmful to the antifuse material positioned between the lower and upper antifuse electrodes. For example, reactive ion plasma etching techniques employed to define small geometry features can result in the accumulation of large static charges giving rise to high voltages across sensitive areas in the integrated circuit being fabricated.

Antifuse materials which are engineered to rupture at predictable (and often relatively low) voltages are very sensitive to this phenomenon. The static charge buildup occurring during processing can easily damage the antifuse device and alter its electrical characteristics without any predictability. The resulting damaged antifuse device will therefore have unpredictable characteristics both with respect to breakdown voltage and with respect to long term stability in either the "on" (conducting) or "off" (non-conducting) states.

OBJECTS AND ADVANTAGES OF THE INVENTION

Accordingly, it is an object of the present invention to provide an ESD protection device useful for protecting a number of antifuses from static discharge damage during the manufacturing process.

It is a further object of the present invention to provide a number of different mechanisms which may be used singly or in combination to provide an ESD protection device useful for protecting a number of antifuses from static discharge damage during the manufacturing process.

Yet a further object of the present invention is to provide an ESD protection device similar in operation to an antifuse and adapted to be fabricated simultaneously with the antifuses that it is designed to protect, but which has a lower breakdown voltage and higher leakage current than those antifuses that it is designed to protect.

These and many other objects and advantages of the present invention will become apparent to those of ordinary skill in the art from a consideration of the drawings and ensuing description of the invention.

SUMMARY OF THE INVENTION

The present invention is directed to providing a process electrostatic discharge ("ESD") protection device incorporated on an integrated circuit chip with the antifuses that it is designed to protect which is formed as close in time as possible to the deposition of the antifuse material layer (the layer being protected) so that ESD protection is available at all practical stages of processing.

According to a first aspect of the invention, an ESD protection device is formed by exposing edges of an antifuse bottom electrode during the antifuse cell open mask/etch step. It is biased on during processing. A sharp corner of the electrode and a deep aspect ratio provide degraded antifuse performance for the protection cell (resulting in reduced breakdown voltage and increased leakage current) and, as designed, the protection cell will rupture before other cells because it has a lower breakdown voltage. Once the protection cell ruptures, it will continue to conduct and protect other antifuses from ESD damage. When processing is complete, the protection cell is biased off and has no effect on the remaining antifuses.

According to a second aspect of the present invention, a deep valley topography is created under a bottom electrode of the protection cell. Because the cell is deeper than the other antifuse cells while retaining the same cell opening size, the step coverage within the protection cell will be reduced and the protection cell will have a lower breakdown voltage than the regular antifuse cells formed with it. In all other respects, it operates as set forth regarding the first aspect of the invention.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Integrated circuit device fabrication processes tend to expose the devices on the wafer under fabrication to various electrostaticly induced voltages. Antifuses formed on such wafers are particularly susceptible to electrostatic discharge ("ESD") damage as they are designed to be programmed by relatively low voltages (typically in the range of about 6 to 100 volts). Since the failure of a single antifuse can result in the rejection of an entire device containing hundreds or thousands of antifuses, it is important to provide some sort of protection to minimize ESD damage during fabrication of these devices.

Figure 1:
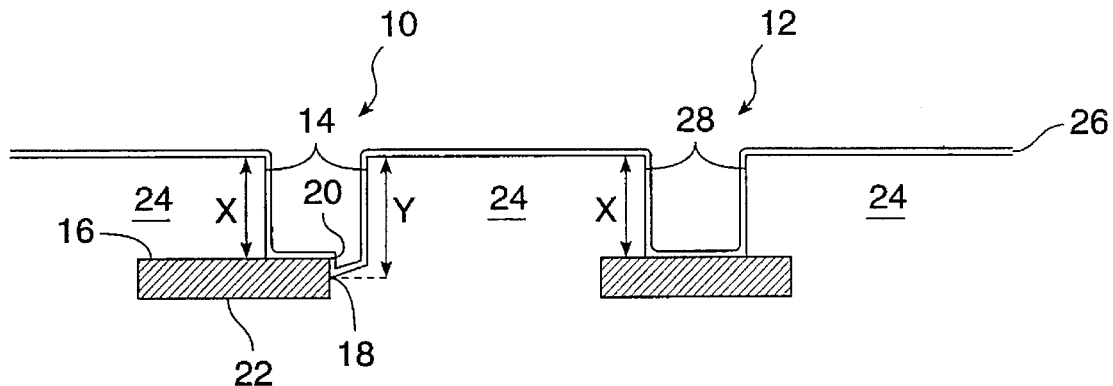
FIG. 1 is a diagram showing an ESD protection device for use with antifuses according to a first aspect of the present invention.
Figure 2:
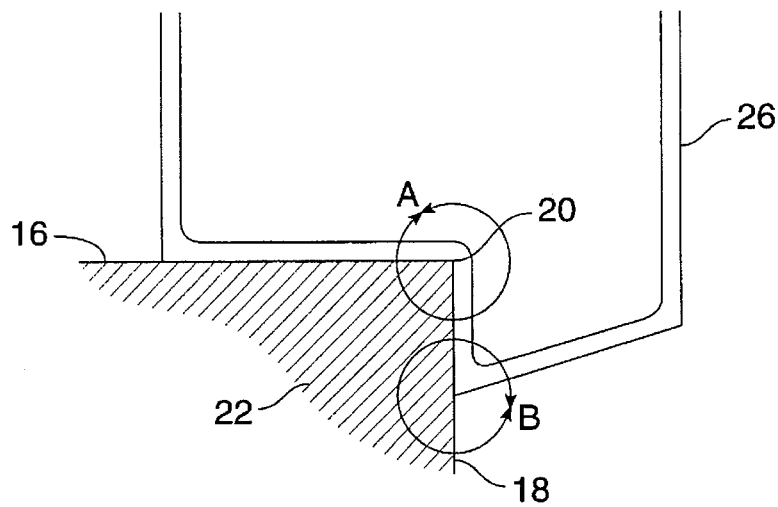
FIG. 2 is an enlargement of a portion of FIG. 1.

Turning to FIG. 1, according to a first preferred embodiment of the present invention, a protection cell 10 is provided to protect a number of simultaneously fabricated antifuse cells 12. One of these is shown in FIG. 1. The cell opening 14 for protection cell 10 exposes the upper surface 16, side surface 18 and corner 20 of bottom electrode 22. As can be seen, interlayer dielectric layer 24 has a thickness of "x" over bottom electrode 22 and a thickness of "y" where y>x to the right of the side surface 18 of bottom electrode 22. This causes two types of effects which tend to reduce the breakdown voltage and increase the leakage current of protection cell 10 versus standard antifuse cell 12. First, the corner (shown enlarged at "A" in FIG. 2) provides a difficult target to cover with antifuse material layer 26, accordingly, step coverage is reduced and the antifuse material layer 26 is thinner at the corner A; similarly, the sharp angle shown at "B" in FIG. 2 presents another difficult target to cover, and, as a result, the antifuse material thickness at B can be expected to be less than that of the antifuse material thickness in antifuse cell 12 which lacks these tortuous features. Second, the difference in vertical height y vs x means that a fixed amount of antifuse material layer deposited into cell opening 14 will have to cover more area than the same amount of antifuse material deposited into cell opening 28 of standard antifuse cell 12. (Note that the areal size or top cross-sectional area of cell opening 14 is the same as that of cell opening 28.) This will result in at least some spots in protection cell 10 being thinner than their corresponding spots in antifuse cell 12. Accordingly, protection cell 10 will break down first in the presence of sufficient ESD voltage resulting in the formation of a conductive link through the antifuse material layer of the protection cell. This will prevent future ESD voltages from damaging standard antifuse 12 as a current path will exist to discharge any such ESD voltage.

As known to those of ordinary skill in the art, the lower electrode 22 may be biased on during processing of the integrated circuit device and, in the absence of a bias current voltage after processing, will remain biased off after processing so that the existence of a conductive link in the protection cell antifuse processing so that the existence of a conductive link in the protection cell antifuse material layer will not affect operation of the standard antifuse cells 12.

Figure 3:
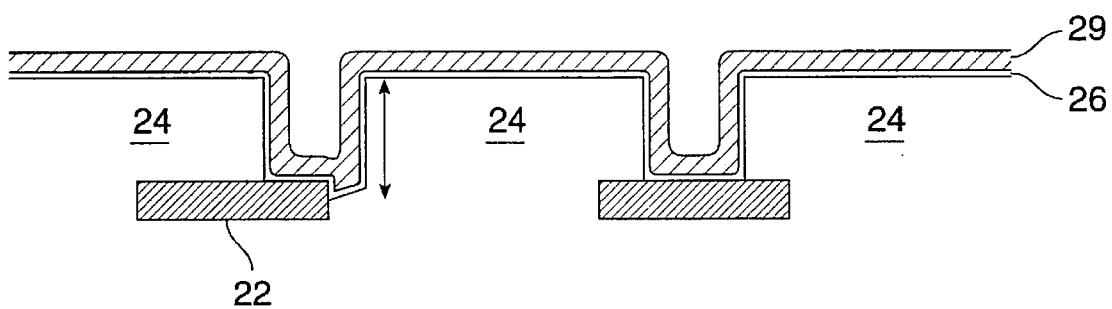
FIG. 3 is a diagram showing an ESD protection device for use with antifuses according to a first aspect of the present invention.

As shown in FIG. 3, an upper metal interconnect layer 29 together with appropriate barrier material layers where necessary may be deposited over antifuse material layer 26 as known to those of ordinary skill in the art.

Figure 4:
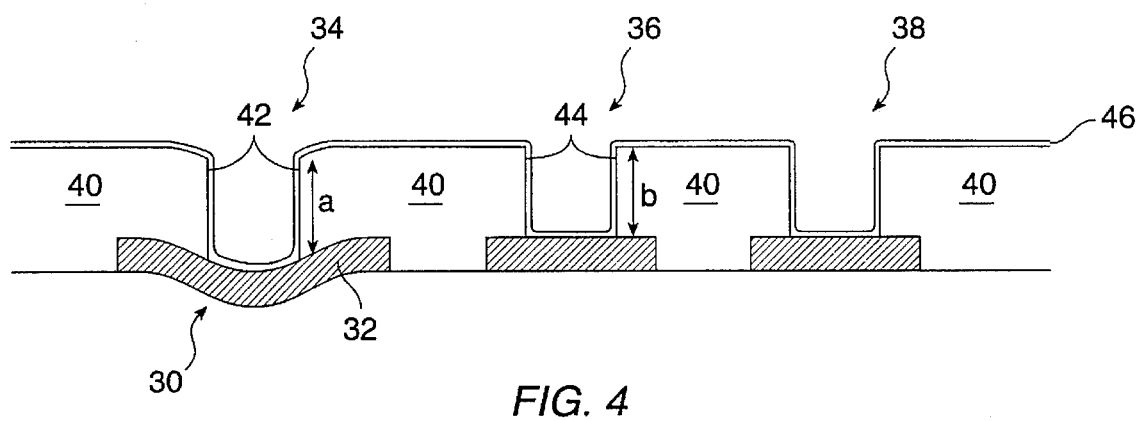
FIG. 4 is a diagram showing an ESD protection device for use with antifuses according to a second aspect of the present invention.

Turning now to FIG. 4, according to a second preferred embodiment of the present invention, a deep valley topology 30 is created under the bottom electrode 32 of protection cell 34 for the protection of standard antifuses 36, 38. By creating a deep valley as shown, the thickness "a" of the interlayer dielectric layer 40 in the vicinity of the protection cell 34 is thicker than the thickness "b" of the interlayer dielectric layer in the vicinity of standard antifuse cells 36, 38. As a result, given that, as before, the size of the cell opening 42 of the protection cell 34 is the same as the size of the cell opening 44 of the standard antifuse 36, the thickness of the antifuse material layer 46 in cell opening 42 of protection cell 34 will be less than the thickness of that layer in cell opening 44 of standard antifuse 36. As a result, protection cell 34 will rupture in the presence of lower voltages than will antifuse cell 36 and it will provide higher leakage currents due to its thinner antifuse material layer.

Figure 5:
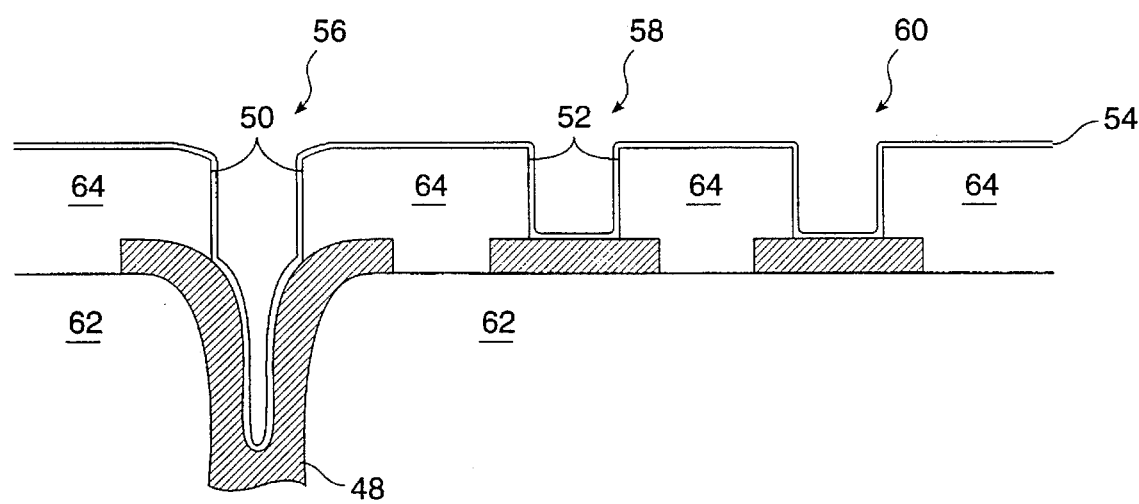
FIG. 5 is a diagram showing an ESD protection device for use with antifuses according to a third aspect of the present invention.

FIG. 5 depicts yet another embodiment of the present invention very similar to the embodiment shown in FIG. 4. In the FIG. 5 embodiment, however, the deep valley topology is replaced with a cell opening or contact opening 48 in a first interlayer dielectric layer 62, however, the effects are the same as stated in regard to FIG. 4, i.e., the effective depth of the cell opening 50 through second interlayer dielectric layer 64 being greater than the effective depth of the standard antifuse cell opening 52 causes antifuse material layer 54 to be thinner in the region of protection cell 56 than it is in the region of standard antifuse cells 58, 60.

While illustrative embodiments and applications of this invention have many more modifications than have been mentioned above are possible without departing from the inventive concepts set forth herein. The invention, therefore, is not to be limited except in the spirit of the appended claims.

What is claimed is:

1. An integrated circuit comprising:

at least one antifuse including a bottom electrode, an interlayer dielectric layer disposed over said bottom electrode, a cell opening of a first areal size and a first maximum depth extending through said interlayer dielectric layer and exposing said bottom electrode, and an antifuse material layer disposed in said cell opening and having a first minimum thickness within said cell opening, said at least one antifuse being programmable at a first minimum voltage; and a process ESD protection device including a bottom ESD electrode, said interlayer dielectric layer disposed over said bottom ESD electrode, an ESD cell opening of said first areal size and a second maximum depth greater than said first maximum depth and extending through said interlayer dielectric layer and exposing said bottom ESD electrode, said antifuse material layer disposed in said ESD cell opening and having a second minimum thickness within said ESD cell opening, said second minimum thickness being less than said first minimum thickness, wherein said process ESD protection device is programmable at a second minimum voltage less than said first minimum voltage.

2. An integrated circuit comprising:

at least one antifuse including a bottom electrode, an interlayer dielectric layer disposed over said bottom electrode, a cell opening of a first areal size and a first maximum depth extending through said interlayer dielectric layer and exposing said bottom electrode, and an antifuse material layer disposed in said cell opening and having a first minimum thickness within said cell opening, said at least one antifuse being programmable at a first minimum voltage; and a process ESD protection device including a bottom ESD electrode, said interlayer dielectric layer disposed over said bottom ESD electrode, an ESD cell opening of said first areal size and a second maximum depth greater than said first maximum depth and extending through said interlayer dielectric layer and exposing at least a portion of a top surface of said bottom ESD electrode, at least a portion of a side surface of said bottom ESD electrode, and a corner disposed between said top surface and said side surface in said bottom ESD electrode, said antifuse material layer disposed in said ESD cell opening and having a second minimum thickness within said ESD cell opening, said second minimum thickness being less than said first minimum thickness and located at about said corner, wherein said process ESD protection device is programmable at a second minimum voltage less than said first minimum voltage.

3. An integrated circuit comprising:

at least one antifuse including a bottom electrode, an interlayer dielectric layer disposed over said bottom electrode, a cell opening of a first areal size through said interlayer dielectric layer and exposing said bottom electrode, and an antifuse material layer disposed in said cell opening and having a first minimum thickness within said cell opening; and a process ESD protection device including a bottom ESD electrode disposed over a deep valley topology, said interlayer dielectric layer disposed over said bottom ESD electrode, an ESD cell opening of said first areal size through said interlayer dielectric layer and exposing said bottom ESD electrode, said antifuse material layer disposed in said ESD cell opening and having a second minimum thickness within said ESD cell opening, said second minimum thickness being less than said first minimum thickness, wherein said interlayer dielectric layer in a region above said bottom ESD electrode has a third minimum thickness and said interlayer dielectric layer in a region above said bottom electrode of said at least one antifuse has a fourth minimum thickness and said fourth minimum thickness is less than said third minimum thickness.

4. An integrated circuit comprising:

at least one antifuse including a bottom electrode, an interlayer dielectric layer disposed over said bottom electrode, a cell opening of a first areal size through said interlayer dielectric layer and exposing said bottom electrode, and a first antifuse material layer disposed in said cell opening and having a first minimum thickness within said cell opening; and a process ESD protection device including a bottom ESD electrode disposed over a deep valley topology, said interlayer dielectric layer disposed over said bottom ESD electrode, an ESD cell opening of said first areal size through said interlayer dielectric layer and exposing said bottom ESD electrode, a second antifuse material layer disposed in said ESD cell opening and having a second minimum thickness within said ESD cell opening, said second minimum thickness being less than said first minimum thickness, wherein said interlayer dielectric layer in a region above said bottom ESD electrode has a third minimum thickness and said interlayer dielectric layer in a region above said bottom electrode of said at least one antifuse has a fourth minimum thickness and said fourth minimum thickness is less than said third minimum thickness.

5. An integrated circuit comprising:

at least one antifuse including a bottom electrode, an interlayer dielectric layer disposed over said bottom electrode, a cell opening of a first areal size and a first depth extending through said interlayer dielectric layer and exposing said bottom electrode, and an antifuse material layer disposed in said cell opening and having a first minimum thickness within said cell opening; and a process ESD protection device including a bottom ESD electrode disposed over a valley topology, said interlayer dielectric layer disposed over said bottom ESD electrode, an ESD cell opening of said first areal size and a second depth greater than said first depth and extending through said interlayer dielectric layer and exposing said bottom ESD electrode, said antifuse material layer disposed in said ESD cell opening and having a second minimum thickness within said ESD cell opening, said second minimum thickness being less than said first minimum thickness, wherein said interlayer dielectric layer in a region above said bottom ESD electrode has a third minimum thickness and said interlayer dielectric layer in a region above said bottom electrode of said at least one antifuse has a fourth minimum thickness and said fourth minimum thickness is less than said third minimum thickness.

6. An integrated circuit comprising:

at least one antifuse including a bottom electrode, an interlayer dielectric layer disposed over said bottom electrode, a cell opening of a first areal size and a first depth extending through said interlayer dielectric layer and exposing said bottom electrode, and an antifuse material layer disposed in said cell opening and having a first minimum thickness within said cell opening, said at least one antifuse being programmable at a first minimum voltage; and a process ESD protection device including a bottom ESD electrode disposed over a valley topology, said interlayer dielectric layer disposed over said bottom ESD electrode, an ESD cell opening of said first areal size and a second depth greater than said first depth and extending through said interlayer dielectric layer and exposing said bottom ESD electrode, said antifuse material layer disposed in said ESD cell opening and having a second minimum thickness within said ESD cell opening, said second minimum thickness being less than said first minimum thickness, wherein said interlayer dielectric layer in a region above said bottom ESD electrode has a third minimum thickness and said interlayer dielectric layer in a region above said bottom electrode of said at least one antifuse has a fourth minimum thickness and said fourth minimum thickness is less than said third minimum thickness, said process ESD protection device being programmable at a second minimum voltage less than said first minimum voltage.

\* \* \* \* \*